(12) United States Patent
Gallo et al.

(10) Patent No.: US 7,161,376 B2
(45) Date of Patent: Jan. 9, 2007

(54) VARIABLE IMPEDENCE OUTPUT BUFFER

(75) Inventors: Girolamo Gallo, Avezzano (IT); Giulio Marotta, Contigliano (IT)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 11/358,235

(22) Filed: Feb. 21, 2006

(65) Prior Publication Data

US 2006/0139051 A1    Jun. 29, 2006

Related U.S. Application Data

(63) Continuation of application No. 10/700,997, filed on Nov. 4, 2003, now Pat. No. 7,034,575.

(30) Foreign Application Priority Data

Feb. 27, 2003    (IT)    ........................ RM2003A0085

(51) Int. Cl.
*H03K 19/0175*    (2006.01)
(52) U.S. Cl. ......................................... 326/27; 326/87
(58) Field of Classification Search ................. 326/26, 326/27, 83–87
See application file for complete search history.

(56) References Cited

U.S. PATENT DOCUMENTS

| 4,829,199 | A | * | 5/1989 | Prater ........................... 326/27 |
| 5,122,690 | A | * | 6/1992 | Bianchi ........................ 326/87 |
| 5,559,447 | A |   | 9/1996 | Rees |
| 5,804,987 | A |   | 9/1998 | Ogawa |
| 5,894,238 | A |   | 4/1999 | Chien |
| 6,060,921 | A |   | 5/2000 | Daniell |
| 6,177,819 | B1 |  | 1/2001 | Nguyen |
| 6,184,730 | B1 |  | 2/2001 | Kwong et al. |
| 6,236,237 | B1 |  | 5/2001 | Wong et al. |
| 6,288,563 | B1 |  | 9/2001 | Muljono et al. |
| 6,608,505 | B1 |  | 8/2003 | Tsuji |

* cited by examiner

*Primary Examiner*—Don Le
(74) *Attorney, Agent, or Firm*—Leffert Jay & Polglaze, PA; Thomas W. Leffert

(57) ABSTRACT

An output buffer for a semiconductor memory device and other semiconductor devices includes a feedback circuit to dynamically control the output impedance of the output buffer in response to a variety of load conditions, thus reducing output ringing. The output buffer may also include circuitry to support selectively converting the device for operation at a variety of supply voltage ranges without the need for additional mask or process steps.

18 Claims, 4 Drawing Sheets

US 7,161,376 B2

VARIABLE IMPEDENCE OUTPUT BUFFER

RELATED APPLICATION

This is a Continuation application of U.S. patent application Ser. No. 10/700,997 now a U.S. Pat. No. 7,034,575 filed Nov. 4, 2003 and titled, VARIABLE IMPEDENCE OUTPUT BUFFER, which is commonly assigned, and the entire contents of which are incorporated herein by reference, and which application claims priority to Italian Patent Application Ser. No. RM2003A000085, filed Feb. 27, 2003, entitled VARIABLE IMPEDENCE OUTPUT BUFFER.

TECHNICAL FIELD OF THE INVENTION

The present invention is related in general to memory devices and more particularly to an output buffer for memory device input/output (I/O) circuitry that provides variable output impedance for improved signal integrity and support for an expanded range of operating voltages.

BACKGROUND OF THE INVENTION

Cellular telephone systems and other portable electronic devices of different manufacture each have their own particular operating characteristics. Meeting these diverse requirements has presented a challenge for component manufacturers. For example, manufacturers of memories for the wireless and portable electronic device market typically offer a variety of memory devices to meet the specifications for different manufacturers. Accordingly, the development and production cost of memory devices for such applications is significantly affected.

One application requirement that varies widely among cellular telephone system manufacturers is the main power supply voltage. While most cellular telephone manufactures have migrated to very low power platforms (VCC=1.65V–2.0V) a large number of applications still require a 3V input output (I/O) interface (VCCQ=2.7V–3.3V). As a consequence, flash memory manufactures typically offer, in addition to full low-voltage devices having both the memory core and I/O interface powered at 1.8V, mixed-power supply devices having a 1.8V main power supply and a 3V I/O interface. Moreover, in the future, manufacturers may decide to migrate to systems having even lower main power supply voltages. Since full low-voltage and mixed-voltage devices typically use different I/O buffer circuits, the two versions essentially present two different design projects and their fabrication requires the generation of two different sets of masks.

Another application requirement that varies from one cellular system to another is I/O load impedance. The large variability of load transmission line characteristics, i.e., the capacitance, inductance, and resistance of the load, renders it very difficult to optimize buffer drive strength. For example, drive strength adequate for a 30 pF load, may result in a noisy output signal due to signal ringing. Signal ringing must of course be avoided while still switching as fast as possible to meet the high-speed performance requirements of modern integrated circuits and designs. The above-mentioned problems, as well as other problems, are addressed at least in part by the present invention and will be understood by reading and studying the following specification.

SUMMARY

An I/O circuit for a semiconductor memory device according to one aspect of the present invention includes an output buffer that includes a driver stage comprising one or more drive transistors, a pre-driver stage and a feedback circuit, such as cascode-connected drive transistors, coupled to the driver stage to dynamically control output impedance in response to an output load condition. In another aspect of the present invention, the output buffer may include circuitry to support selectively converting the output buffer for operation in a variety of supply voltage ranges without the need for additional mask or process steps.

For one embodiment, the invention provides an output buffer for a semiconductor memory device. The output buffer includes a driver stage comprising one or more drive transistors, a pre-driver stage coupled to the driver stage and a feedback circuit to dynamically control output buffer impedance in response to a load condition.

For another embodiment, the invention provides an output buffer for a flash memory device. The output buffer includes a pull-up driver coupled between a power supply node and an output node, a pull-down driver coupled between a ground node and the output node, a pull-up pre-driver coupled to the pull-up driver and a pull-down pre-driver coupled to the pull-down driver. The pull-up and pull-down drivers each comprise a plurality of cascode-connected drive transistors, wherein a gate of at least one of the cascode-connected drive transistors in each driver is coupled to the output node.

For yet another embodiment, the invention provides a flash memory device. The memory device includes a non-volatile memory array, an output buffer coupled to the memory array and at least one programmable interconnect to selectively configure the output buffer for operation at a predetermined supply voltage range.

For still another embodiment, the invention provides a method for providing an impedance-adaptive output buffer for use in a memory device. The method includes providing feedback from an output node of the output buffer to a first cascode-connected transistor coupled between a power supply node and the output node and providing the feedback from the output node of the output buffer to a second cascode-connected transistor coupled between a ground node and the output node.

Further embodiments of the invention include methods and apparatus of varying scope.

DETAILED DESCRIPTION

Figure 1:
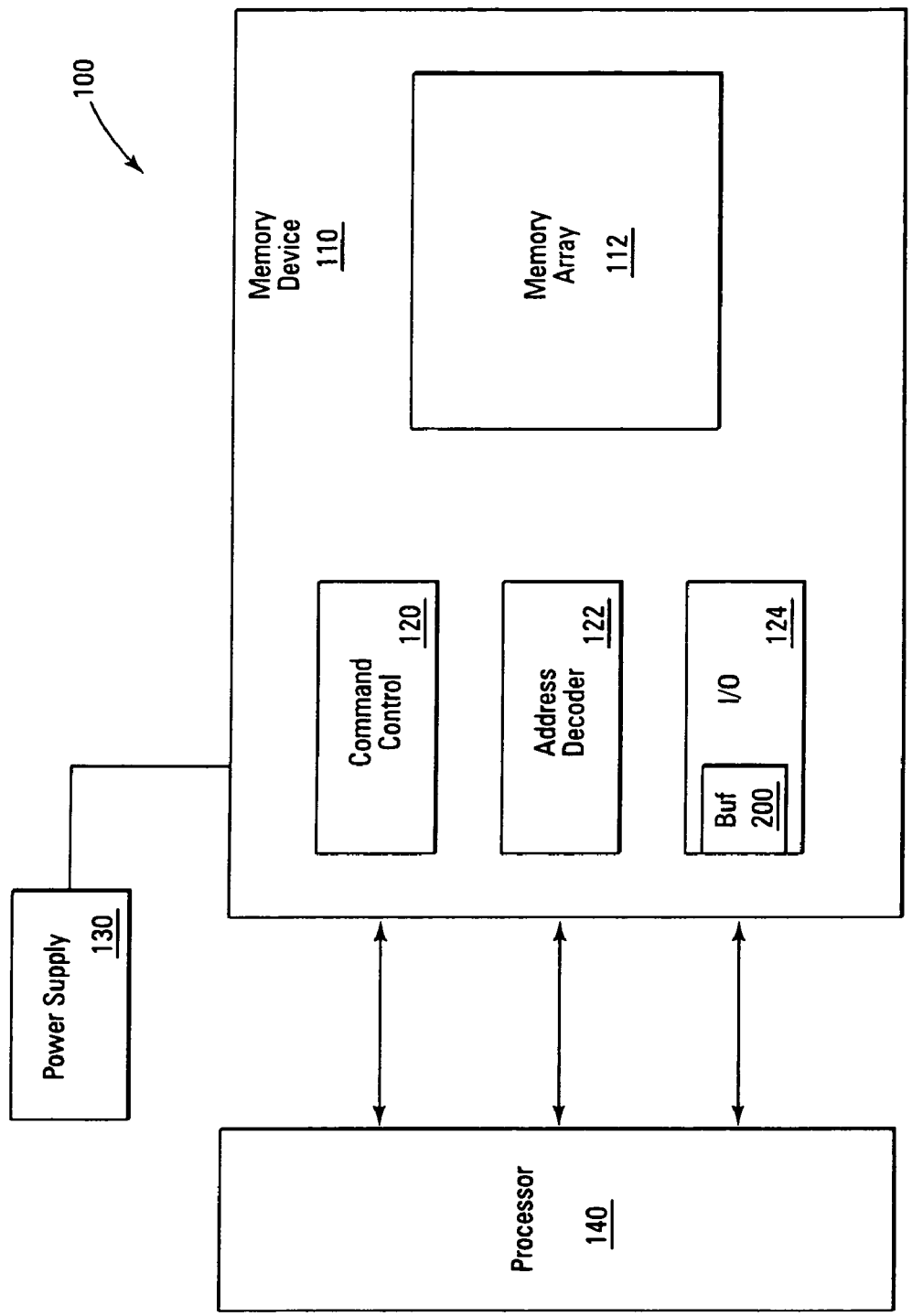
FIG. 1 shows a system including a processor, a memory circuit, a power supply, and an I/O circuit according to the teachings of the present invention.

In the following detailed description of the invention, reference is made to the accompanying drawings that form a part hereof, and in which is shown, by way of illustration, specific embodiments in which the invention may be practiced. In the drawings, like numerals describe substantially similar components throughout the several views. These embodiments are described in sufficient detail to enable those skilled in the art to practice the invention. Other embodiments may be utilized and structural, logical, and electrical changes may be made without departing from the scope of the present invention. The following detailed description is, therefore, not to be taken in a limiting sense, and the scope of the present invention is defined only by the appended claims and equivalents thereof.

FIG. 1 shows a simplified block diagram of an electronic system 100 including a memory circuit 110, a power supply 130 and a processor 140. Memory 110 includes a memory array 112 of nonvolatile memory cells such as flash memory, and a command control circuit 120 that controls detailed operations of memory 110 such as the various individual steps necessary for carrying out writing, reading, and erasing operations. Memory 110 also includes an address decoder circuit 122 for decoding and selecting addresses provided by processor 140 to access appropriate memory cells in memory array 112, and an input/output (I/O) circuit 124 for providing bi-directional communications between processor 140 and memory circuit 110. In particular, I/O circuit 124 includes an output buffer circuit 200 for providing optimal output signal levels to devices external to the memory circuit 110. For purposes of simplicity of explanation, the memory circuit 110 will be described in the context of flash memory, although one skilled in the art will recognize that other types of memory circuits, such as, for example, dynamic random access memory (DRAM), static random access memory (SRAM), or electrically erasable read only memory (EEPROM), as well as other integrated circuit or semiconductor devices, also may implement an output buffer in accordance with one or more aspects of the present invention. Similarly, the flash memory may be of a NOR or NAND architecture, asynchronous or synchronous, and may employ a virtual segment architecture.

Figure 2:
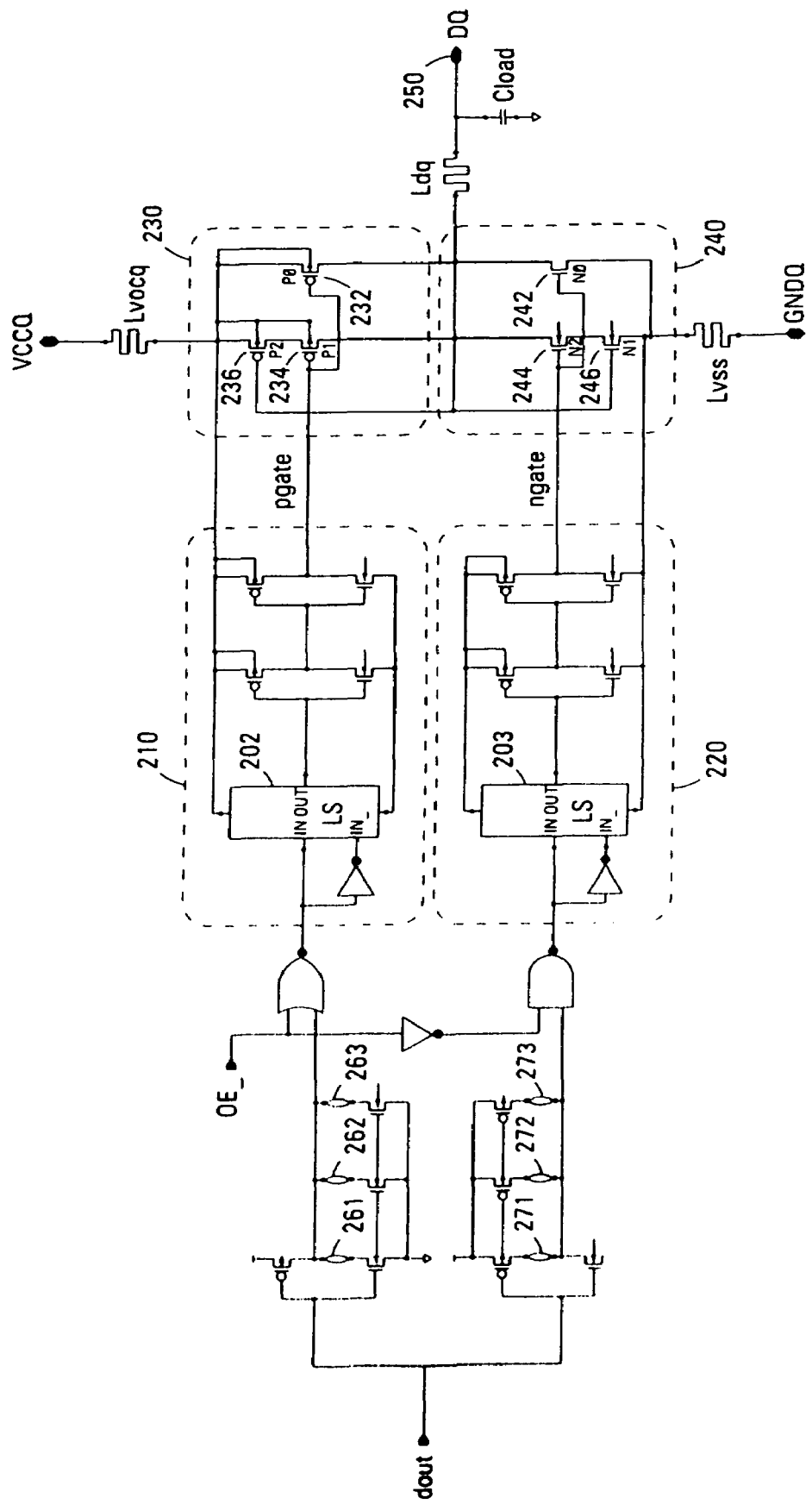
FIG. 2 shows an illustration of one embodiment of an I/O circuit according to the teachings of the present invention.

A simplified schematic diagram of an embodiment of an output buffer circuit 200 according to the present invention is shown in FIG. 2. In this example, output buffer circuit 200 may operate in the so called "extended low-voltage range" (VCC=1.6–2.0V and VCCQ=1.6V–2.3V). In other embodiments of the present invention, as will be described below, an output buffer circuit according to the present invention may be converted to a circuit capable of operating in a wider voltage range (VCCQ=1.6–3.3V) without the need for additional masks or process steps.

Output buffer circuit 200 includes four main blocks: a pull-up pre-driver section 210, a pull-down pre-driver section 220, a pull-up output driver section 230, and a pull-down output driver section 240.

The pull-up output driver section 230, which is driven by the corresponding pull-up pre-driver section 210, includes pull-up transistor (P0) 232 and cascode-connected transistors 234 and 236 (P1 and P2) coupled between the output pad (DQ) 250 and the I/O power supply node, VCCQ, adapted to receive a supply voltage. The gates of pull-up transistors (P0) 232 and (P1) 234 are driven by the signal pgate, generated by the pull-up pre-driver section, while the gate of pull-up transistor 236 (P2) is directly connected to the output pad 250. The signal provided to the output pad 250 is representative of the data signal DOUT, and thus representative of a data value of a cell of the memory array.

Similarly, pull-down output driver section 240, driven by the corresponding pull-down pre-driver section 220, includes pull-down transistor 242 (N0) and cascode-connected transistors 244 and 246 (N1 and N2) coupled between output pad DQ 250 and the I/O ground node, GNDQ, adapted to receive a supply ground potential. The gates of pull-down transistors 242 (N0) and 244 (N1) are driven by the signal ngate, generated by pull-down pre-driver section 220, while the gate of transistor 246 (N2) is directly connected to DQ pad 250. Input signals to the pre-driver sections 210 and 220 include output enable signal OE_ and data signal DOUT. Output signals from pre-driver sections 210 and 220 are pgate and ngate, respectively, which are both indicative of the data signal DOUT and which control the gates of the pull-up and pull-down drivers, respectively. The signals ngate and pgate generally maintain the same logic level, but their transitions may be shifted in time.

Output buffer 200 operates essentially as follows. When output enable signal OE_ is set to logic high, the output of buffer 200 is in the high impedance state. When output enable signal OE_ is set to logic 0, the signals pgate, and ngate are enabled and the pull-up and pull-down drivers 230 and 240 may be turned-on according to the DOUT logic value.

Pre-driver sections 210 and 220 each include a level shifter circuit (LS) 202 and 203, respectively for translating the voltage level. Level shifter circuits 202 and 203 advantageously allow operating the buffer with 0-stand-by-power even if the I/O interface supply voltage VCCQ is different from the core memory supply VCC. A more detailed description of level shifter circuits 202 and 203 is provided below with reference to FIG. 3.

The cascode configuration of the driver transistors in the pull-up and pull-down driver sections provides dynamic control of the impedance of the output driver and improves the data output signal rise and fall time. As a result, the output ringing is significantly reduced. The circuit operates essentially as follows. Consider a high to low transition of the data signal. In this case, ngate and pgate signals switch from 0 to VCCQ. Therefore, transistors 232 (P0) and 234 (P1) of the pull-up section 230 are switched off and there is no current path between VCCQ and DQ 250. In the pull-down section, at the beginning of the transition, all 3 transistors 242 (N0), 244 (N1) and 246 (N2) are switched on, so the two branches made of transistor 242 (N0) and the cascode-connected transistors 244 (N1) and 246 (N2) both contribute to the load charging current.

As soon as the output voltage decreases and becomes close to the switching threshold (Vtn) of the n-channel transistors, the current path through transistor 244 (N1) and 246 (N2) is progressively switched off and the output current decreases accordingly. When the DQ pad 250 voltage becomes lower than Vtn, transistor 246 (N2) is turned off and the output current is now due to the transistor 242 (N0) path only. This behavior results in increased output impedance when the output is reaching its final GNDQ voltage, so that the output ringing is significantly reduced in a design according to the present invention compared to a conventional output buffer design.

A similar effect is obtained for a low to high to low transition of the data signal resulting from the symmetrical (or dual) cascode circuit introduced in the pull-up driver section 230.

Figure 4:
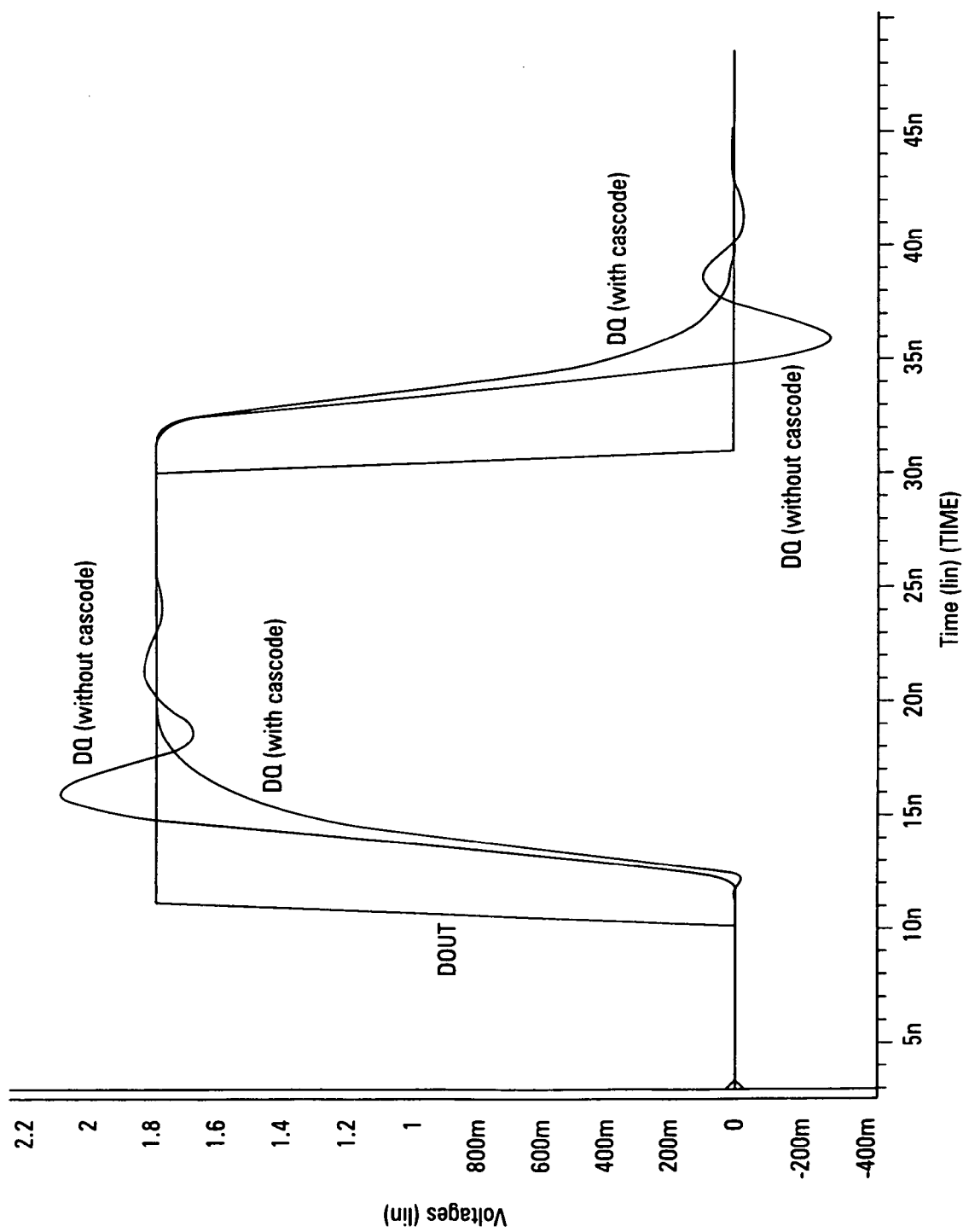
FIG. 4 is a graph showing a comparison of I/O output voltage for a typical I/O for a memory compared with an I/O according to the present invention.

FIG. 4 shows a Spice simulation of results obtained from a circuit model of the embodiment of the output buffer of FIG. 2 according to the present invention. In FIG. 4, the input voltage DOUT is compared to the output voltage DQ from a circuit that does not use the cascoded configuration in the pull-up and pull-down drivers versus the output voltage DQ from an embodiment of an output buffer circuit according to the present invention. Both simulations refer to the following conditions: Lvss=Lvccq=16 nH, Ldq=8 nH, Cload=30 pF. As can be seen, feedback circuitry according to the present invention significantly reduces output ringing, but has a very limited impact on the output buffer delay time.

As mentioned, circuits according to the present invention may be converted to operate in the wider 1.6–3.3V VCCQ range via a 4-layer layout option to support those applications that may require a 3V I/O interface. This conversion basically involves replacing each thin oxide transistor connected to the VCCQ and GNDQ power supplies with a corresponding thick oxide device. The transistors affected by this change are those in the output driver and pre-driver sections, including the voltage shifters. The present invention may be applied to other lower or higher output buffer supply voltage ranges as may be called for by manufacturers of semiconductor memory devices.

In one example, the layout conversion may be accomplished without the need for additional mask or process steps because thick oxides are commonly used in other circuits of the flash device, such as pumps and memory cores, etc. The conversion may be accomplished by changing the poly gate, n+ and p+ levels. Poly gates must also be resized because the minimum length of a thick oxide transistor is generally longer than that of a thin oxide device, while n+ and p+ diffusions correspondingly may be replaced by the corresponding HVn+ and HVp+ levels. Advantageously, the changes mentioned above require only minor layout editing effort since the space for accommodating longer poly gates has been accounted for in advance. Given the difference in I–V characteristics between thin and thick oxide transistors, a small number of changes in one of the metal masks may also be required to better adapt the circuit to operate in the wider VCCQ range. For example, the size of the pull-down stages in the voltage level shifters would need to be increased. In order to customize the circuit for use in a different voltage range, a programmable interconnect may be employed to selectively engage or disengage the circuit elements for the particular voltage range. For example, a device according to the present invention may include a selection system operative to receive a signal to select which voltage range will be operative for the device. For example, in a case when the system is implemented as part of an integrated circuit, the selection system may include one or more metal mask options. The metal mask options may have two or more user-selectable conditions (e.g., different fixed voltage levels), each of which provides a different selection signal, thereby controlling the voltage range of the device. Other programmable interconnects such as jumpers, fusible links, or electrically or optically programmable links, and the like, may also be used for configuration in a post-production process.

Figure 3:
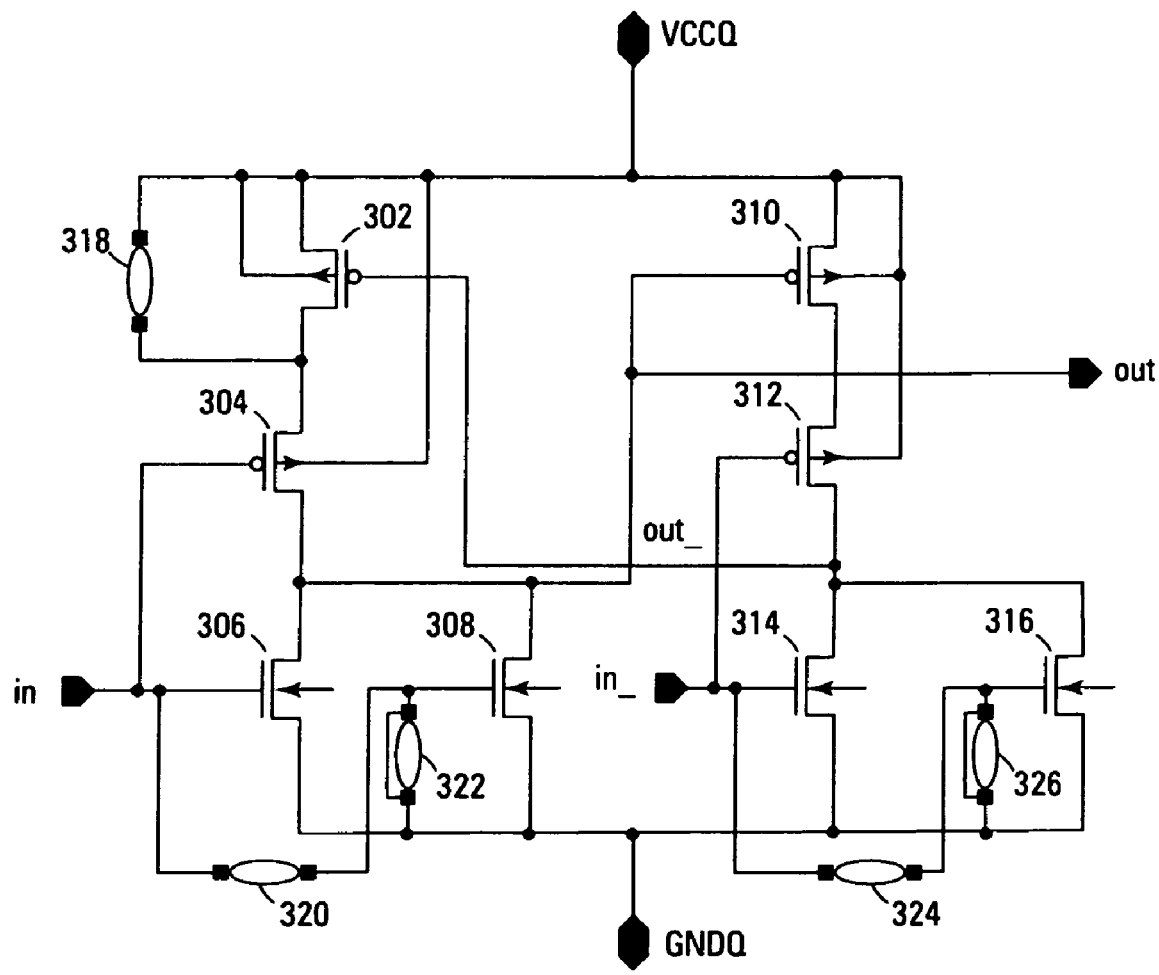
FIG. 3 is a block diagram of one embodiment of a voltage-selectable level shifter circuit according to the teachings of the present invention.

FIG. 3 shows a simplified schematic diagram of one embodiment of a level shifter circuit 300 according to the present invention that may be converted to operation from one voltage range to another by selectively opening or closing metal mask options. Level shifter circuit 300 may be used in place of level shifters 202 and 203 of FIG. 2. Level shifter circuit 300 includes PMOS transistors 302 and 304 coupled in series with NMOS transistor 306 between VCCQ and GNDQ. The gates of NMOS transistor 306 and PMOS transistor 304 are coupled to the input (in) of level shifter 300, which in turn is selectively coupled to the gate of NMOS transistor 308 by metal mask option 320. NMOS transistor 308 is coupled in parallel with NMOS transistor 306. NMOS transistor 308 is also coupled between the gate of PMOS transistor 310 and GNDQ. Metal mask option 322 selectively shunts the gate of NMOS transistor 308 to GNDQ. PMOS transistor 310 is coupled in series to PMOS transistor 312 and NMOS transistor 314 between VCCQ and GNDQ. NMOS transistor 314 is coupled in parallel with NMOS transistor 316. In FIG. 3, closing the metal mask options 320 and 324 and opening metal options 322 and 326 will increase the size of the pull-down stage of the level shifter 300, thus facilitating operation at higher supply voltages. Similarly, if the circuit is operated at VCC=VCCQ, a voltage shift function is not required. In such circumstances, the metal mask option 318 may be closed to force the level shifter circuit to operate like an inverter, resulting in faster operation. In addition to increasing the size of the pull-down and pull-up stages, relatively thick oxide transistors should be used for operation at higher voltages. Thus, in addition to selecting the appropriate metal mask options to affect the size of the pull-down and pull-up stages, the fabrication process would also be modified to adjust the thickness of the gate dielectric of the transistors of the level shifter 300 as appropriate for the chosen operating voltage. While thick oxide transistors could be used at lower operating voltages, thinner oxides are preferable to avoid the resulting speed penalty associated with thicker oxides at lower voltages.

FIG. 2 also shows p_ovlp metal mask options 261, 262 and 263 and n_ovlp metal mask options 271, 272 and 273. One or more of these metal mask options may be opened or closed to fine tune the disoverlap of the ngate and pgate signals, i.e., to ensure that while the ngate signal has a logic level sufficient to activate the NMOS transistors 242 and 244, the pgate signal has a logic level insufficient to activate the PMOS transistors 232 and 234, and vice versa. This is desirable to avoid the unwanted simultaneous conduction of pull-up and pull-down sections of the output driver, which would unnecessarily increase power consumption. This may be accomplished by adjusting the rates of change in the signal levels provided to the pre-driver stages such that a rate of change of the ngate and pgate signals will be relatively quick when transitioning from a logic level adapted to activate their associated driver stage to a logic level adapted to deactivate their associate driver stage and relatively slow when transitioning from a logic level adapted to deactivate their associated driver stage to a logic level adapted to activate their associate driver stage, thus causing an activated driver stage to deactivate prior to activating the other driver stage. Disoverlap is preferably long enough to ensure that simultaneous conduction of pull-up and pull-down sections will not occur. However, increasing levels of disoverlap will delay signal transitions.

CONCLUSION

An output buffer for a memory device has been described. The output buffer includes a feedback circuit to dynamically control the output impedance of the output driver in response to a variety of load conditions, thus reducing output ringing. The output buffer of the present invention may also include circuitry to support operation at a variety of supply voltages without the need for additional mask or process steps by one or more programmable interconnects to select the desired voltage range.

Although specific embodiments have been illustrated and described herein, it will be appreciated by those of ordinary skill in the art that any arrangement that is calculated to achieve the same purpose may be substituted for the specific embodiments shown. Many adaptations of the invention will be apparent to those of ordinary skill in the art. Accordingly, this application is intended to cover any adaptations or variations of the invention. It is manifestly intended that this invention be limited only by the following claims and equivalents thereof.

What is claimed is:

1. A method for providing an impedance-adaptive output buffer, comprising:
   providing a first signal indicative of a data value to at least two first current paths coupled between a power supply node and an output node of the output buffer;
   providing a second signal indicative of the data value to at least two second current paths coupled between a ground node and the output node of the output buffer;
   deactivating a first one of the first current paths if the output node has a first logic level; and
   deactivating a first one of the second current paths if the output node has a second logic level.

2. The method of claim 1, wherein the first signal and second signal generally maintain the same logic level.

3. The method of claim 2, further comprising delaying a transition of one of the signals relative to the other in response to a change in an input data value.

4. The method of claim 1, wherein when the first signal and the second signal have the same logic level, each of the first current paths are deactivated and at least one of the second current paths is activated, or each of the second current paths are deactivated and at least one of the first current paths is activated.

5. The method of claim 1, wherein deactivating a first one of the first or second current paths further comprises providing a signal level of the output node of the output buffer to a gate of a transistor in the first one of the first or second current paths, respectively.

6. The method of claim 5, wherein providing a signal level of the output node of the output buffer to a gate of a transistor further comprises providing the signal level of the output node of the output buffer to the gate of a cascade-connected transistor.

7. A level shifter for selectively converting a semiconductor device for operation at a variety of supply voltage ranges, the level shifter comprising:
   a first and a second PMOS transistor coupled in series with a first NMOS transistor between a power supply node and a ground node, wherein gates of the first NMOS transistor and the second PMOS transistor are coupled to an input of the level shifter;
   a second NMOS transistor coupled in parallel with the first NMOS transistor, wherein the second NMOS transistor is coupled between a gate of a third PMOS transistor and the ground node and wherein a gate of the second NMOS transistor is selectively coupled to the input of the level shifter by a first programmable interconnect;
   a second programmable interconnect coupled between the gate of the second NMOS transistor and the ground node;
   a fourth PMOS transistor coupled in series with the third PMOS transistor and a third NMOS transistor between the power supply node and the ground node, wherein gates of the third NMOS transistor and the fourth PMOS transistor are coupled to a complement of the input of the level shifter, which in turn is selectively coupled to a gate of a fourth NMOS transistor by a third programmable interconnect;
   a fourth NMOS transistor coupled in parallel with the third NMOS transistor, wherein the fourth NMOS transistor is coupled between a gate of the first PMOS transistor and the ground node and wherein a gate of the fourth NMOS transistor is selectively coupled to the complement of the input of the level shifter by a third programmable interconnect; and
   a fourth programmable interconnect coupled between the gate of the fourth NMOS transistor and the ground node.

8. The level shifter of claim 7, further comprising:
   a fifth programmable interconnect coupled in parallel with the first PMOS transistor.

9. A level shifter for selectively converting a semiconductor device for operation at a variety of supply voltage ranges, the level shifter comprising:
   a first PMOS transistor having a gate, a first source/drain region and a second source/drain region, wherein the first source/drain region is coupled to a power supply node;
   a second PMOS transistor having a gate, a first source/drain region and a second source/drain region, wherein the first source/drain region of the second PMOS transistor is coupled to the second source/drain region of the first PMOS transistor and wherein the gate of the second PMOS transistor is coupled to receive an input signal;
   a first NMOS transistor having a gate, a first source/drain region and a second source/drain region, wherein the gate of the first NMOS transistor is coupled to receive the input signal, wherein the first source/drain region of the first NMOS transistor is coupled to the second source/drain region of the second PMOS transistor, and wherein the second source/drain region of the first NMOS transistor is coupled to a ground node;
   a second NMOS transistor having a gate, a first source/drain region and a second source/drain region, wherein the first source/drain region of the second NMOS transistor is coupled to the first source/drain region of the first NMOS transistor and to an output node of the level shifter, and wherein the second source/drain region of the second NMOS transistor is coupled to the second source/drain region of the first NMOS transistor;
   a third PMOS transistor having a gate, a first source/drain region and a fifth source/drain region, wherein the first source/drain region of the third PMOS transistor is coupled to the power supply node and wherein the gate of the third PMOS transistor is coupled to the output node of the level shifter;
   a fourth PMOS transistor having a gate, a first source/drain region and a second source/drain region, wherein the first source/drain region of the fourth PMOS transistor is coupled to the second source/drain region of the third PMOS transistor and wherein the gate of the fourth PMOS transistor is coupled to receive a complement of the input signal;
   a third NMOS transistor having a gate, a first source/drain region and a second source/drain region, wherein the gate of the third NMOS transistor is coupled to receive the complement of the input signal, wherein the first source/drain region of the third NMOS transistor is coupled to the second source/drain region of the fourth PMOS transistor and to the gate of the first PMOS transistor, and wherein the second source/drain region of the third NMOS is coupled to the ground node;
   a fourth NMOS transistor having a gate, a first source/drain region and a second source/drain region, wherein the first source/drain region of the fourth NMOS transistor is coupled to the first source/drain region of the third NMOS transistor and wherein the second source/drain region of the fourth NMOS transistor is coupled to the first source/drain region of the third NMOS transistor;

a first programmable interconnect coupled between the second source/drain region of the second NMOS transistor and the gate of the second NMOS transistor;

a second programmable interconnect coupled between the gate of the first NMOS transistor and the gate of the second NMOS transistor;

a third programmable interconnect coupled between the second source/drain region of the fourth NMOS transistor and the gate of the fourth NMOS transistor; and a fourth programmable interconnect coupled between the gate of the third NMOS transistor and the gate of the fourth NMOS transistor.

10. The level shifter of claim 9, further comprising:
a fifth programmable interconnect coupled between the first source/drain region of the first PMOS transistor and the second source/drain region of the first PMOS transistor.

11. A method for providing an impedance-adaptive output buffer, comprising:

providing a first signal indicative of a data value to at least two first current paths coupled between a power supply node and an output node of the output buffer;

providing a second signal indicative of the data value to at least two second current paths coupled between a ground node and the output node of the output buffer, wherein the second signal generally maintains the same logic level as the first signal in response to the same data value;

providing a signal level of the output node to a gate of a transistor in a first one of the first current paths, wherein the transistor in the first one of the first current paths is adapted to deactivate the first one of the first current paths if the signal level of the output node has a first logic level; and providing the signal level of the output node to a gate of a transistor in a first one of the second current paths, wherein the transistor in the first one of the second current paths is adapted to deactivate if the signal level of the output node has a second logic level.

12. The method of claim 11, further comprising delaying a transition of one of the first and second signals relative to the other in response to a change in an input data value.

13. The method of claim 11, wherein when the first signal and the second signal have the same logic level, each of the first current paths are deactivated and at least one of the second current paths is activated, or each of the second current paths are deactivated and at least one of the first current paths is activated.

14. The method of claim 11, wherein providing the signal level of the output node to a gate of a transistor in the first one of the first or second current paths further comprises providing the signal level of the output node to the gate of a cascade-connected transistor in the first one of the first or second current paths, respectively.

15. A method for providing an impedance-adaptive output buffer, comprising:

providing a first signal indicative of a data value to at least two first current paths coupled between a power supply node and an output node of the output buffer;

providing a second signal indicative of the data value to at least two second current paths coupled between a ground node and the output node of the output buffer, wherein the second signal generally maintains the same logic level as the first signal in response to the same data value;

deactivating a first one of the first current paths if the output node has a first logic level; and deactivating a first one of the second current paths if the output node has a second logic level;

wherein when the first signal and the second signal have the same logic level, each of the first current paths are deactivated and at least one of the second current paths is activated, or each of the second current paths are deactivated and at least one of the first current paths is activated.

16. The method of claim 15, further comprising delaying a transition of one of the signals relative to the other in response to a change in an input data value.

17. The method of claim 15, wherein deactivating a first one of the first or second current paths further comprises providing a signal level of the output node of the output buffer to a gate of a transistor in the first one of the first or second current paths, respectively.

18. The method of claim 17, wherein providing a signal level of the output node of the output buffer to a gate of a transistor further comprises providing the signal level of the output node of the output buffer to the gate of a cascade-connected transistor.

* * * * *